(12) United States Patent
Cooper et al.

(10) Patent No.: US 10,261,555 B1
(45) Date of Patent: Apr. 16, 2019

(54) AIRFLOW IN AUGMENTED AND/OR VIRTUAL REALITY HEAD MOUNTED DISPLAY DEVICE

(71) Applicant: Google LLC, Mountain View, CA (US)

(72) Inventors: James Cooper, Sunnyvale, CA (US); Keeline Wilcox, Mountain View, CA (US); Joseph Edward Clayton, San Francisco, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/911,866

(22) Filed: Mar. 5, 2018

Related U.S. Application Data

(60) Provisional application No. 62/491,524, filed on Apr. 28, 2017.

(51) Int. Cl.
| | | |
|---|---|---|
| *H05K 5/00* | (2006.01) | |
| *G06F 1/20* | (2006.01) | |
| *G06F 1/16* | (2006.01) | |
| *H05K 7/20* | (2006.01) | |

(52) U.S. Cl.
CPC ............ *G06F 1/20* (2013.01); *G06F 1/163* (2013.01); *H05K 7/20145* (2013.01); *H05K 7/20154* (2013.01); *H05K 7/20209* (2013.01); *H05K 7/20972* (2013.01)

(58) Field of Classification Search
CPC ....................................................... H05K 5/00
See application file for complete search history.

(56) References Cited

U.S. PATENT DOCUMENTS

| | | | |
|---|---|---|---|
| 2011/0060471 A1* | 3/2011 | Aggus ...................... | G06F 1/20 700/282 |
| 2016/0066640 A1 | 3/2016 | Weller et al. | |
| 2016/0255748 A1* | 9/2016 | Kim ................... | H05K 7/20972 361/695 |

\* cited by examiner

*Primary Examiner* — Jerry Wu
(74) *Attorney, Agent, or Firm* — Brake Hughes Bellermann LLP

(57) ABSTRACT

A head mounted display device may include a housing, including a user-facing cavity and an electronics compartment. At least one fan may be installed in the electronics compartment. A plurality of intake ports may be defined in a peripheral wall portion of the user-facing cavity, and at least one air discharge port may be defined in a wall portion of the electronics compartment. A plurality of air channels may extend between the user-facing cavity and the electronics compartment. Operation of the at least one fan may draw external air into the housing through the plurality of air intake ports into the user—facing cavity, and into the electronics compartment through the plurality of air channels, for discharge from the housing through the at least one discharge port, to provide cooling of the user-facing cavity and the electronics compartment.

20 Claims, 11 Drawing Sheets

US 10,261,555 B1

AIRFLOW IN AUGMENTED AND/OR VIRTUAL REALITY HEAD MOUNTED DISPLAY DEVICE

CROSS-REFERENCE TO RELATED APPLICATION

This application is a Nonprovisional of, and claims priority to, U.S. Patent Application No. 62/491,524, filed on Apr. 28, 2017, entitled "AIRFLOW IN AUGMENTED AND/OR VIRTUAL REALITY HEAD MOUNTED DISPLAY DEVICE", which is incorporated by reference herein in its entirety.

TECHNICAL FIELD

This document relates, generally, to a head mounted display device, and airflow through a head mounted display device.

BACKGROUND

A head mounted display (HMD) device is a type of mobile device which may be worn by a user, for example, on a head of the user, to experience an immersive augmented reality and/or virtual reality environment. Some HMDs may be fitted, or seated, against the user's face, surrounding the user's eyes, so that the physical environment is essentially blocked and not visible to the user wearing the HMD, to enhance the immersive experience for the user.

SUMMARY

In one aspect, a head mounted display device may include a housing; an optical component assembly installed in the housing; a user-facing cavity defined by a first peripheral portion of the housing and the optical component assembly installed in the housing; an electronics compartment defined by a second peripheral portion of the housing and the optical component assembly installed in the housing; at least one fan installed in the electronics compartment; a plurality of air intake ports defined in a peripheral wall portion of the user-facing cavity; a plurality of air channels connecting the user-facing cavity and the electronics compartment; and at least one air discharge port defined in a peripheral wall portion of the electronics compartment, at a position corresponding to the at least one fan.

In another aspect, a head mounted display device may include a housing; an optical component assembly installed in the housing; a first cavity defined in the housing, at a first side of the optical component assembly; a second cavity defined in the housing, at a second side of the optical component assembly; at least one air channel connecting the first cavity and the second cavity; and a cooling system. The cooling system may include at least one fan installed in the second cavity; at least one heat sink installed in the second cavity, at a position corresponding to an exhaust side of the at least one fan; and at least one heat pipe in thermal contact with at least one electronic component installed in the second cavity, and in thermal contact with the at least one heat sink, so as to transfer heat absorbed from the at least one electronic component to the at least one heat sink.

The details of one or more implementations are set forth in the accompanying drawings and the description below. Other features will be apparent from the description and drawings, and from the claims.

DETAILED DESCRIPTION

A head mounted display (HMD) device may display image content on a display of the HMD to engage a user's visual senses, and may convey audio content to the user via an audio output device included in and/or connected to the HMD to engage the user's auditory senses, to provide the user with an immersive virtual experience. In the example HMD 100 shown in FIG. 1, the HMD 100 is fitted, or seated, against the front of the head of the user, essentially blocking the ambient physical environment (outside of the HMD 100) from the user's view. This arrangement, in which the ambient physical environment is not visible to the user wearing the HMD 100, may enhance the user's immersive virtual experience.

In some situations, a temperature and/or a humidity level of an area, or space, or cavity, between the HMD 100 and the front of the head of the user, may increase over time, as the HMD 100 remains in place on the head of the user. Elevation of the temperature and/or the humidity levels in this user-facing cavity may cause discomfort to the user, and/or may cause fogging in optical components of the HMD 100, obstructing the user's view of the display in the HMD 100, and detracting from the user's immersive virtual experience. Generation of heat by electronic components of the HMD 100 may exacerbate this problem, and overheating of the electronic components in an electronics compartment of the HMD 100 may cause the HMD 100 to malfunction.

In an HMD including a cooling system, in accordance with implementations described herein, one or more fans may draw external ambient air into the user-facing cavity of the HMD to reduce and/or maintain a temperature in the user-facing cavity and/or to reduce and/or maintain a humidity level in the user-facing cavity. Continued operation of the one or more fans may draw air from the user-facing cavity into the electronic compartment, to cool the electronic components, and/or to cool one or more heat sinks, as the air is discharged from the HMD.

Figure 1:
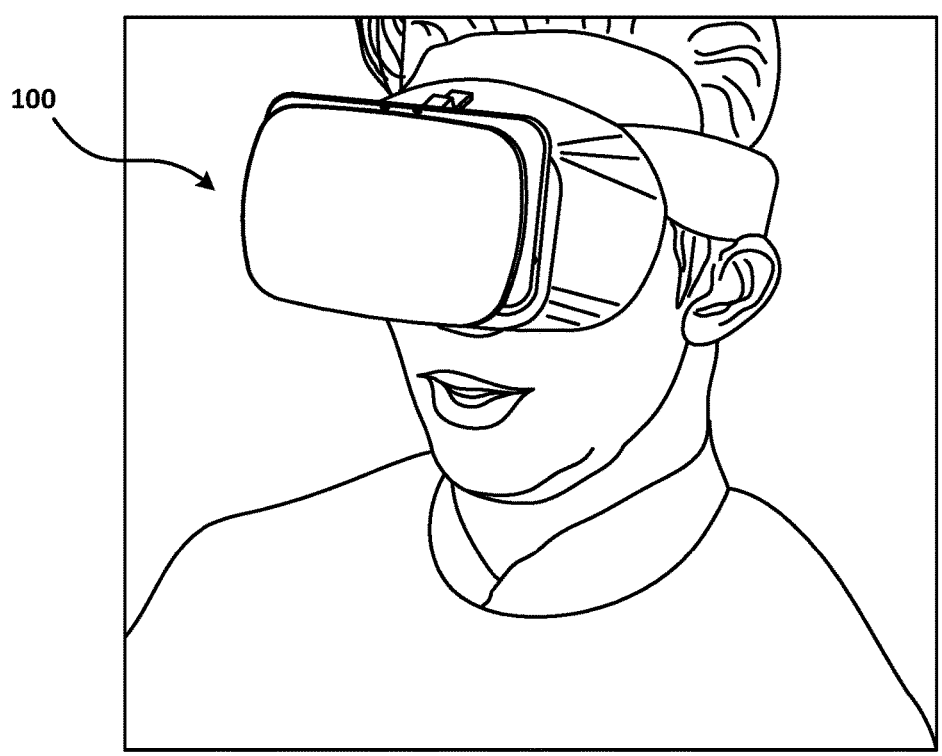
FIG. 1 illustrates a user wearing an example HMD, in accordance with implementations described herein.
Figure 2A:
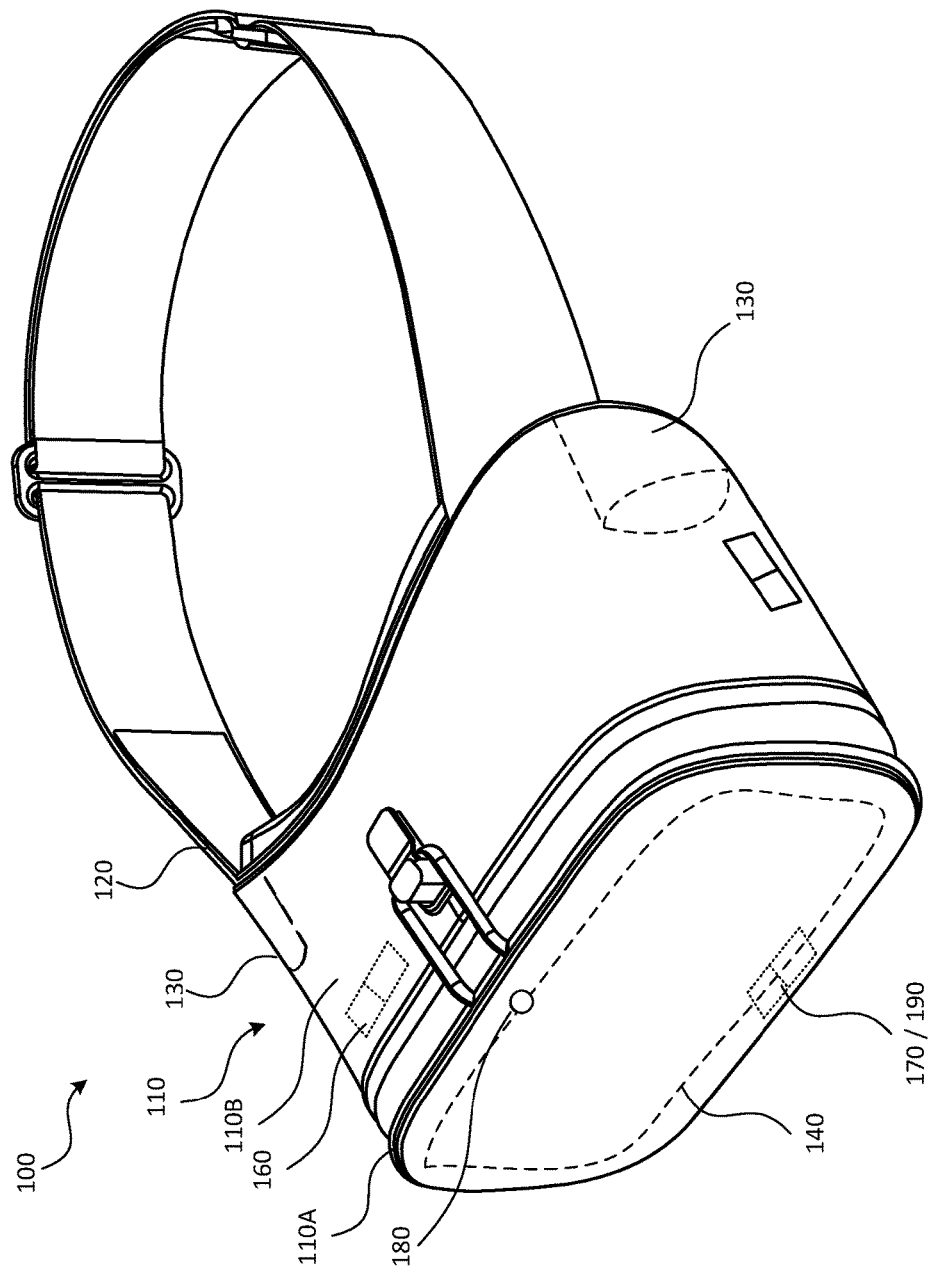
FIGS. 2A-2B are perspective views of an example HMD, in accordance with implementations described herein.
Figure 2B:
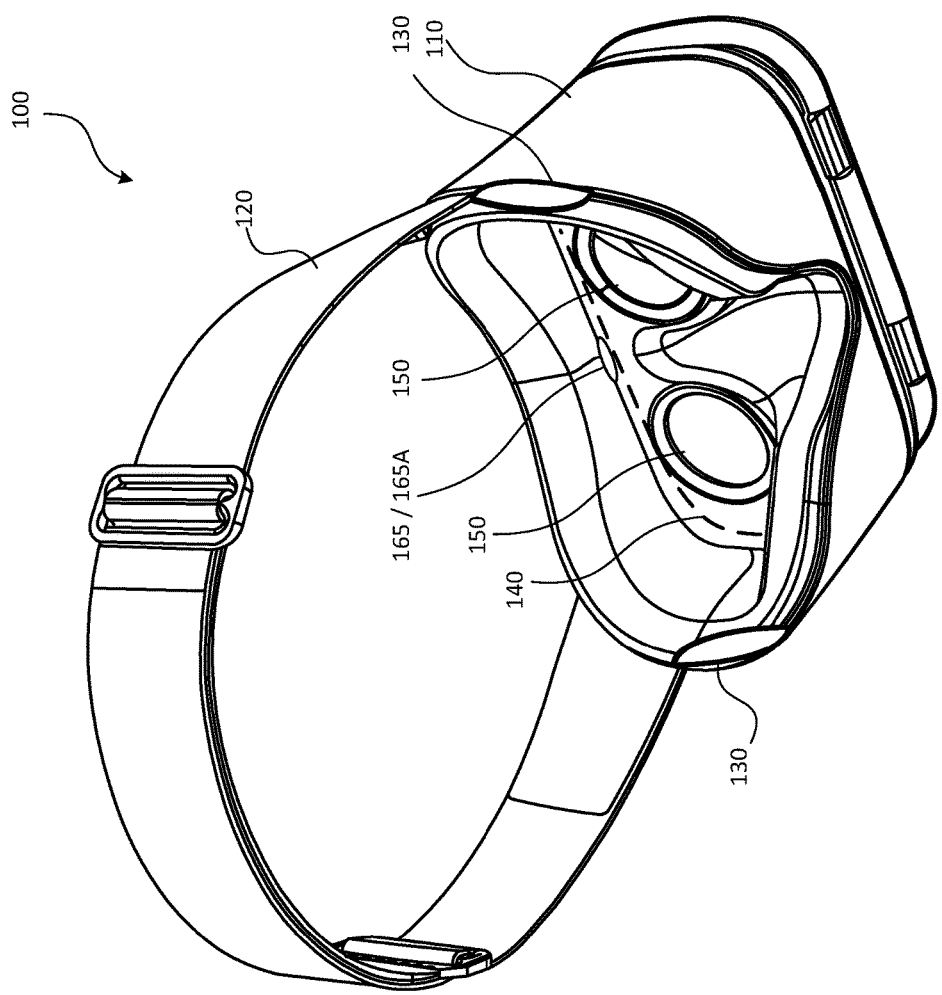
Figure 3:
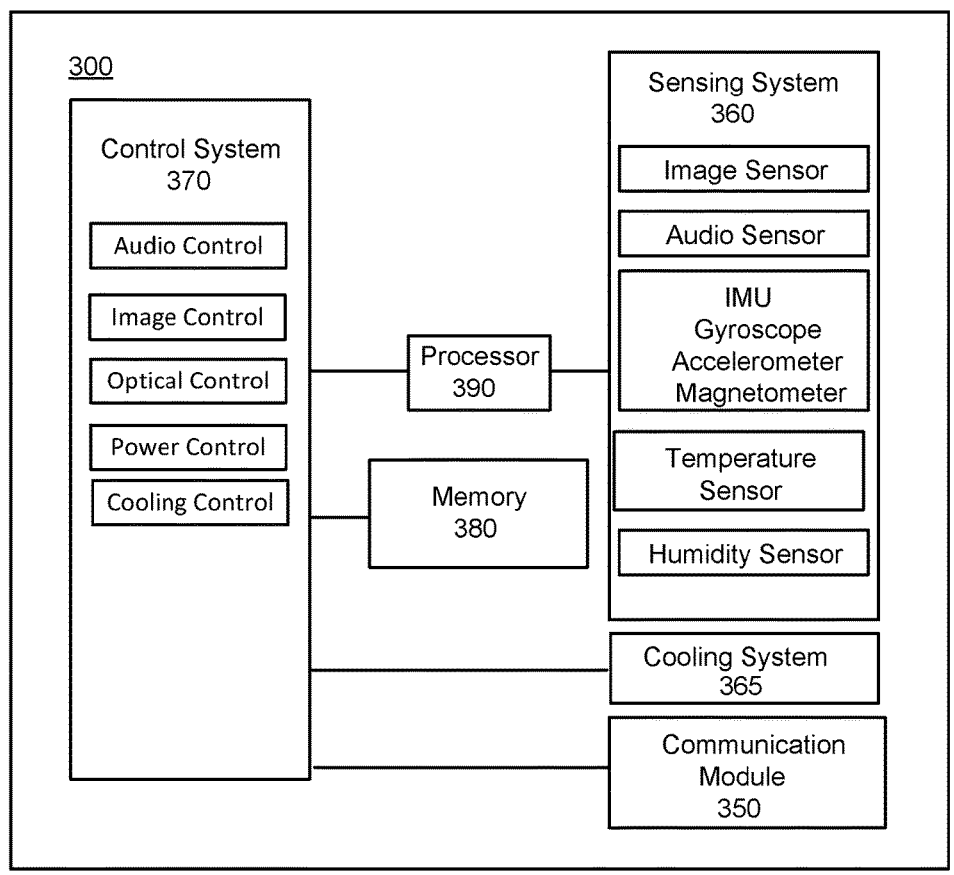
FIG. 3 is a block diagram of an example electronic device, in accordance with implementations described herein.

FIGS. 2A and 2B illustrate features of an example HMD 100, such as, for example, the HMD 100 worn by the user shown in FIG. 1. In particular, FIG. 2A is a front perspective view of the example HMD 100, and FIG. 2B is a rear view of a housing 110 and an optical component assembly 150 of the HMD 100. FIG. 3 is a block diagram of an example electronic device 300, and in particular, an example electronic device 300 such as the HMD shown in FIGS. 2A and 2B.

As shown in FIGS. 2A-2B the example HMD 100 may include a housing 110 coupled to a frame 120. The housing 110 may include a front portion 110A coupled to a base portion 110B. A display 140 may be positioned at an interior facing side of the front portion 110A of the housing 110. In some implementations, the display 140 may be installed in the housing 110 as a dedicated display of the HMD 100. In some implementations, the display 140 may be included in a separate electronic device, such as, for example, a smartphone, that may be removably inserted into and removed from the housing 110 of the HMD 100.

An optical component assembly 150, including, for example, lenses aligned with the display 140, may be mounted in the housing 110. In some implementations, the HMD 100 may include a sensing system 160 including various sensors such as, for example, audio sensor(s), image/light sensor(s), positional sensors (e.g., an inertial measurement unit including a gyroscope, an accelerometer, and/or a magnetometer), temperature sensor(s), moisture/humidity sensor(s), and the like. The HMD 100 may also include a control system 170 and a processor 190 controlling various control system devices to facilitate operation of the HMD 100. In some implementations, the HMD 100 may include a camera 180 to capture still and moving images. In some implementations, the HMD 100 may include a gaze tracking device 165 including one or more image sensors 165A to detect and track an eye gaze of the user, which may be processed as a user input.

Audio components 130 may be coupled to the HMD 100, and/or may be included in the HMD 100. For example, in some implementations, the HMD 100 may include integral audio output devices, or speakers, for example, in the housing 110 of the HMD 100, to direct audio output toward the ears of the user when the HMD 100 is worn by the user. In some implementations, auxiliary audio output devices such as, for example, headphones, earbuds, over the ear headphones and the like may be worn by the user to output audio content associated with video content displayed to the user on the display 140 of the HMD 100.

A block diagram of an electronic device 300, such as, for example, the example HMD 100 described above, is shown in FIG. 3. The electronic device 300 may include a sensing system 360 and a control system 370, which may be similar to the sensing system 160 and the control system 170, respectively, of the example HMD 100 shown in FIGS. 2A and 2B. The electronic device 300 may include a cooling system 365, to provide for thermal management of the electronic device 300. The sensing system 360 may include, for example, a light sensor, an audio sensor, an image sensor, a distance/proximity sensor, a positional sensor, a temperature and/or humidity sensor, and/or other sensors and/or different combination(s) of sensors. The control system 370 may include, for example, a power/pause control device, audio and video control devices, an optical control device, a transition control device, a cooling control device, and/or other such devices and/or different combination(s) of devices. The sensing system 360 and/or the control system 370 may include more, or fewer, devices, depending on a particular implementation, and may have a different physical arrangement that shown. A processor 390 may be in communication with the sensing system 360 and the control system 370, a memory 380, and a communication module 350 may provide for communication between the electronic device 300 and one or more external device(s) as discussed above.

When the system is operating to generate and display, for example, a virtual reality environment to the user on the display 140 of the HMD 100, the housing 110 of the HMD 100 may be seated against the head, or face, of the user, as shown in FIG. 1. This seating of the HMD 100 against the face of the user essentially forms a seal or barrier that inhibits, or blocks, light from entering the interior confines of the housing 110 of the HMD 100. While this arrangement may facilitate and enhance the user's immersion in the virtual environment, this arrangement may also cause the user some discomfort. That is, a temperature level and/or a humidity level in an area within the housing 110, between the user's head and the lenses 150 (hereinafter referred to as the user-facing cavity) may increase over time, due to, for example, body heat generated by the user, operation of the electronic components of the HMD 100 and the like. In some situations, these elevated temperature and/or humidity levels may cause fogging of the lenses 150, which are exposed (e.g., disposed within) to the user-facing cavity, obstructing the user's view of the display 140. This discomfort and/or reduced visibility may detract from the user's experience in the immersive virtual environment. Additionally, elevated temperatures of the electronic components of the HMD 100 over time may not only exacerbate this problem, but may also cause malfunction of the electronic components, thus affecting operation of the HMD 100.

In an HMD, in accordance with implementations described herein, a quiet, lightweight, compact cooling system may provide cooling to both the user-facing cavity and the electronics compartment, while having little to no impact on the external profile and/or external appearance of the HMD.

FIGS. 4A-4E are schematic views of an example HMD 100 including a cooling system, in accordance with implementations as described herein. FIGS. 4A-4E are not necessarily to scale. Rather, certain aspects of the example HMD 100 illustrated in FIGS. 4A-4E may be exaggerated, to provide for clarity in illustration and discussion.

Figure 4A:
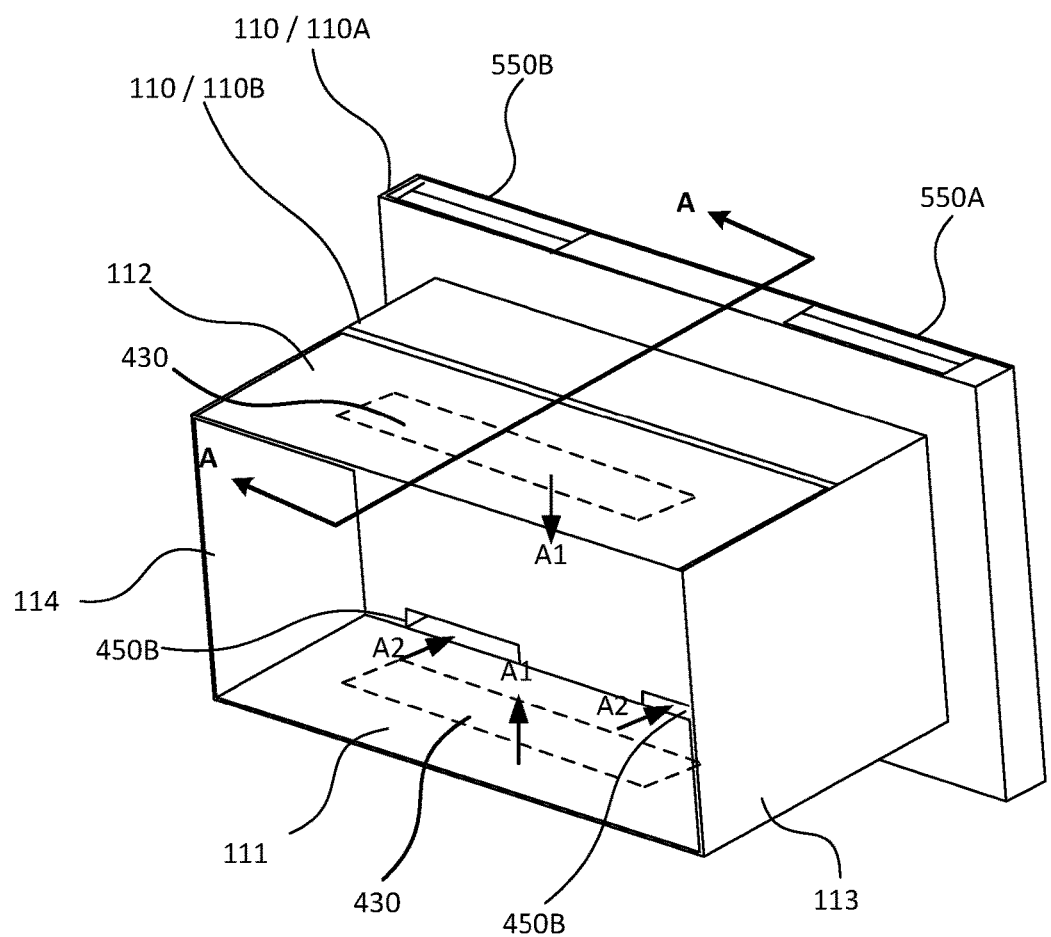
FIGS. 4A-4E illustrate an example HMD including a cooling system, in accordance with implementations described herein.
Figure 4B:
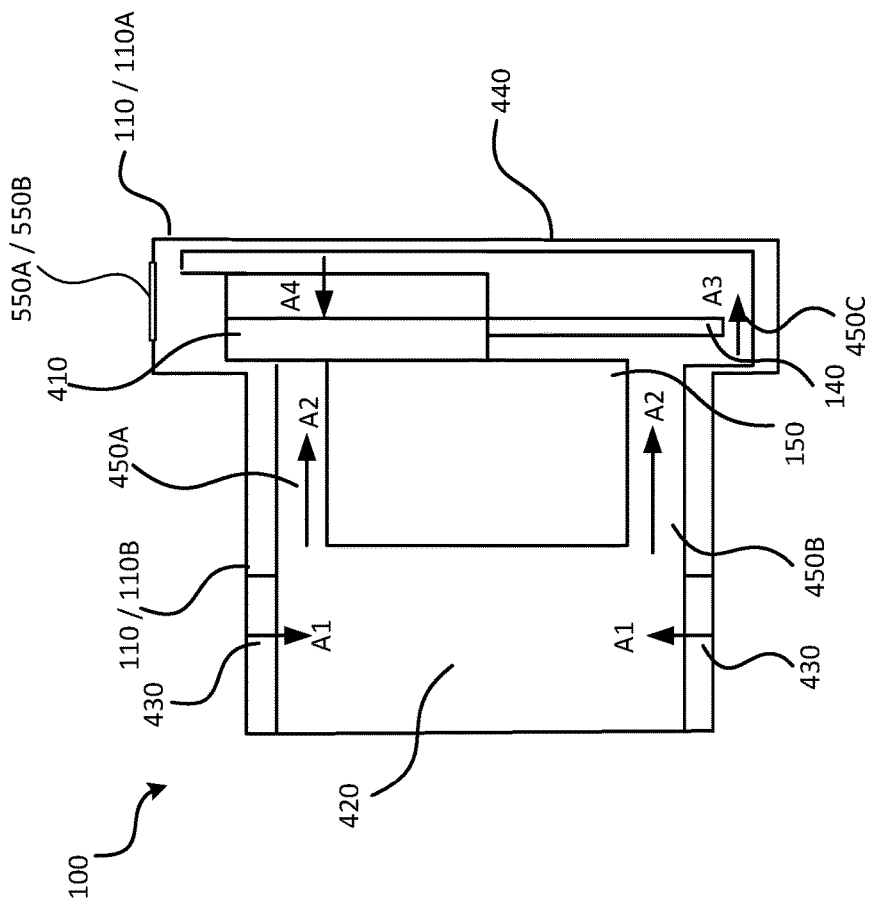

FIG. 4B is a cross sectional view taken along line A-A of FIG. 4A. As shown in FIGS. 4A and 4B, the example HMD 100 may include a first cavity 420, or a user-facing cavity 420, defined between the head, or face, of the user and the optical component assembly 150 of the HMD 100. An outer peripheral portion of the user-facing cavity 420 may be defined by the peripheral walls of the base portion 110B of the housing 110. The HMD 100 may also include a second cavity 440, or an electronics compartment 440, in which electrical components of the HMD 100 such as, for example, the controller, the processor and the like, may be housed. The electronics compartment 440 may be defined by the peripheral walls of the front portion 110A of the housing and the optical component assembly 150. Thus, the optical component assembly 150 may, essentially, separate the user-facing cavity 420 from the electronics compartment 440.

The HMD 100 may include a cooling system including at least one fan 410 installed in the housing 110, for example, in a portion of the electronics compartment 440, as shown in FIG. 4B. The HMD 100 may also include a plurality of air intake areas 430 formed in peripheral portions of the housing 110, and a plurality of air channels 450 that guide air through the HMD 100, as shown in FIG. 4B. In some implementations, the cooling system may also include at least one heat pipe 470 and/or at least one heat sink 460 (see FIG. 5B) to draw heat away from the electronic components in the electronics compartment 440. The at least one heat sink 460 may also be cooled by the cooling flow generated due to the suction force produced by the at least one fan 410 as the air is discharged from the HMD 100. The at least one heat pipe 470 may be in thermal contact with a corresponding portion of the housing 110. The thermal contact between the at least one heat pipe 470 and the housing 110 may allow the at least one heat pipe 470 to transfer heat, or thermal energy, from electronic components in the electronics compartment 440 to an outside of the housing 110.

In particular, operation of the at least one fan 410 may cause ambient external air to be drawn into the user-facing cavity 420 through the air intake areas 430 formed in a peripheral wall portion of the housing 110 surrounding the user-facing cavity 420, as illustrated by the arrows A1 shown in FIGS. 4A and 4B. This flow of ambient external air through the user-facing cavity 420 may cool the user-facing cavity 420, and may reduce a temperature level and/or a humidity level in the user-facing cavity 420, thus reducing or substantially eliminating, for example, fogging of the optical components exposed to the user-facing cavity 420. Continued operation of the at least one fan 410 may cause the air from the user-facing cavity 420 to be drawn through the air channels 450, toward the electronics compartment 440. For example, in some implementations, continued operation of the at least one fan 410 may cause air to be drawn from the user-facing cavity 420 through at least one first air channel 450A (at a top portion of the HMD 100, between the optical component assembly 150 and/or the housing 110) and through at least one second air channel 450B (at a bottom portion of the HMD 100, between the optical component assembly 150 and the housing 110), in the direction of the arrows A2, and into the electronics compartment 440 through at least one third air channel 450C, in the direction of the arrow A3, as shown in FIG. 4B. The air (e.g., cooling air), drawn into the electronics compartment 440 of the HMD 100 in this manner, may cool electronic components housed in the electronics compartment 440. Continued operation of the at least one fan 410 may cause cooling air to flow across the electronic components in the electronics compartment 440 for cooling, and to be discharged from the HMD 100, for example, in the direction of the arrow A4, as shown in FIG. 4B.

In some implementations, the plurality of air intake areas 430, or air intake ports 430, may be defined in one of, or some of, or all of, a bottom surface 111 and/or a top surface 112, and/or a right lateral surface 113 and/or a left lateral surface 114 of the base portion 110B of the housing 110. In some implementations, the air intake areas 430 formed in the bottom surface 111 and/or the top surface 112 of the housing 110 may be larger than the air intake areas 430 formed in the right lateral surface 113 and/or the left lateral surface 114 of the housing 110. In some implementations, all of the air intake areas 430 may be substantially the same size. For example, in some implementations, all of the air intake areas 430 may have substantially the same cross sectional area. In some implementations, the air intake areas may be a variety of different sizes. In some implementations, the air intake areas 430 may be covered, for example, with a fabric and/or a mesh material and/or foam type material, allowing air to pass through, but maintaining some level of opacity to block ambient light from entering the confines of the housing 110 of the HMD 100.

Figure 4C:
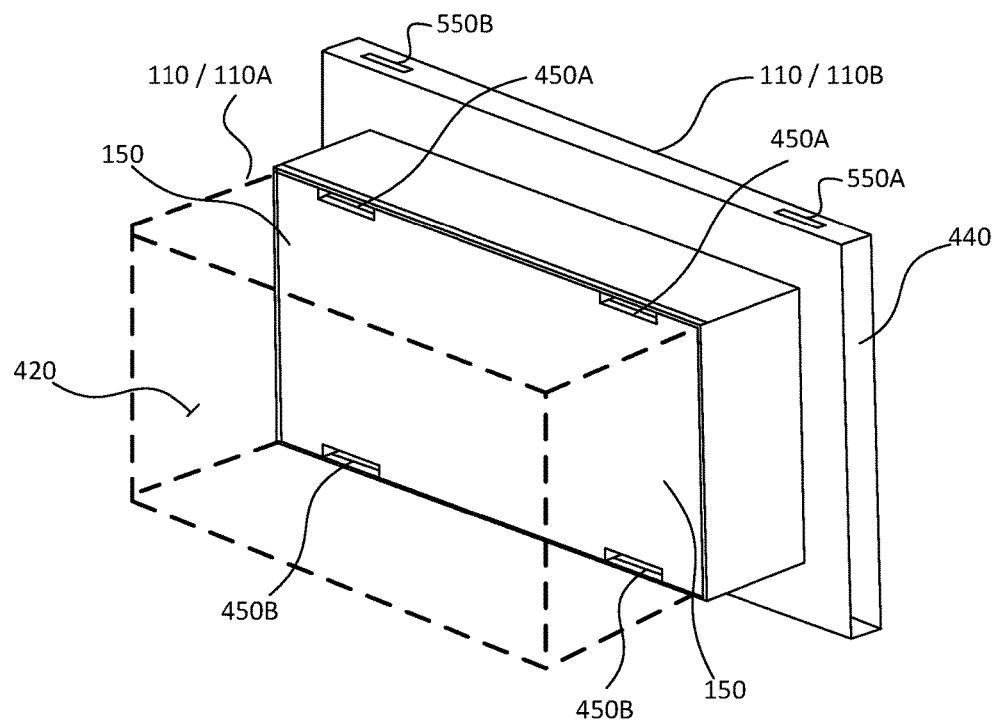
Figure 4D:
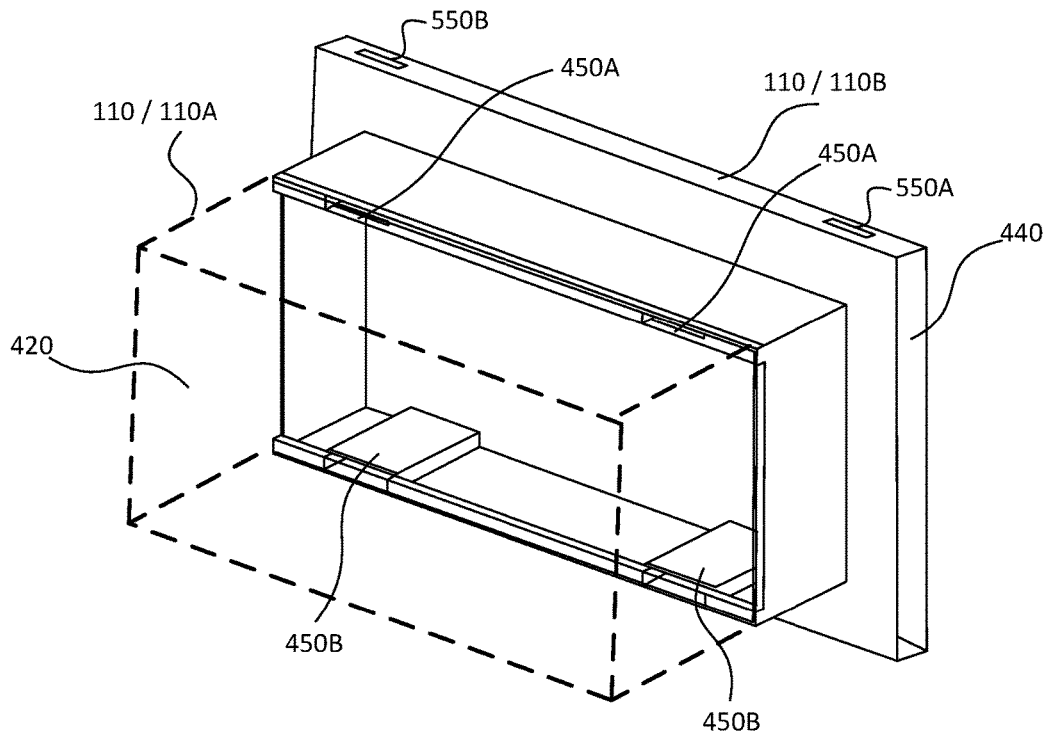
Figure 4E:
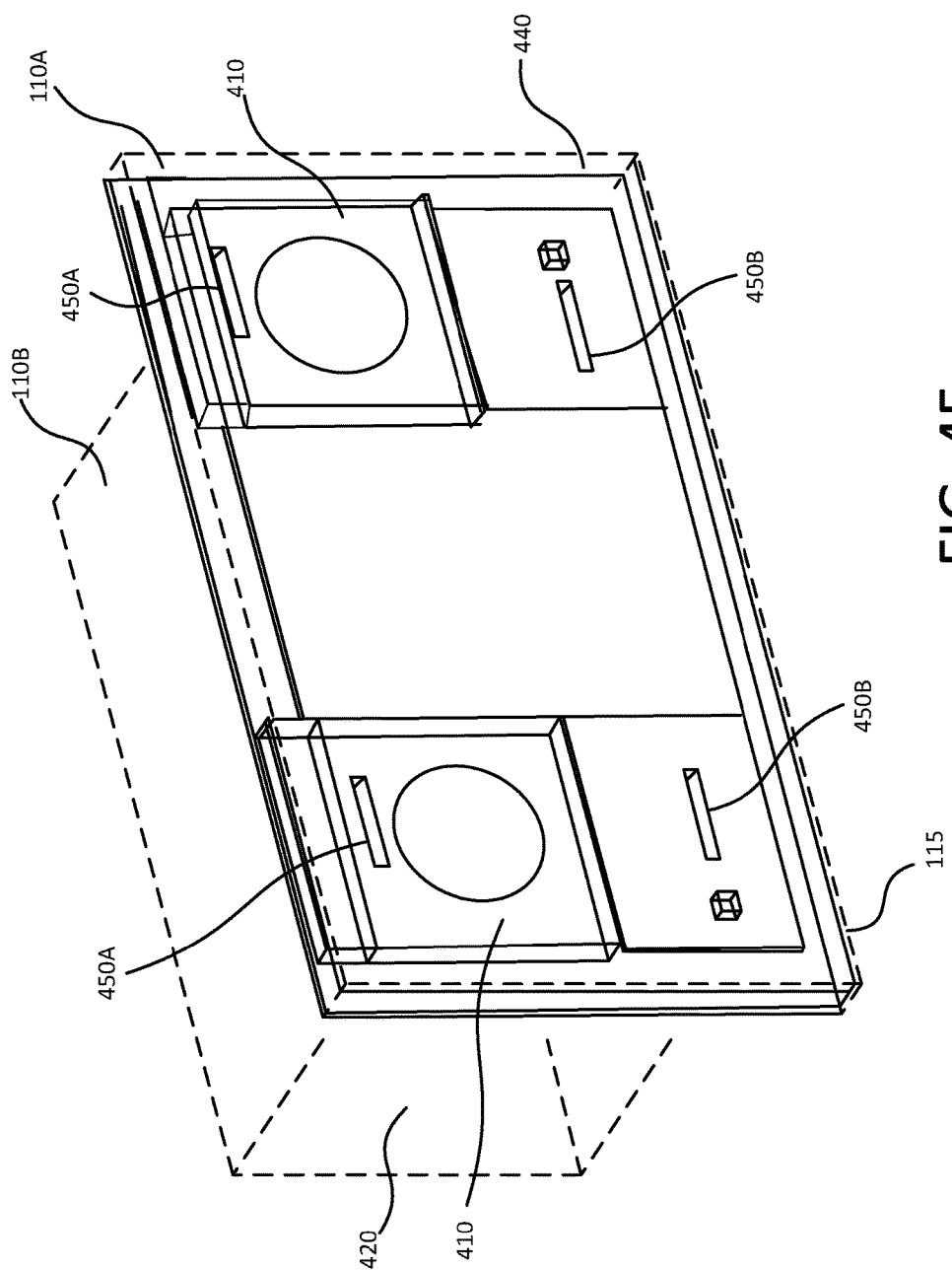

FIG. 4C is a rear perspective view of the example HMD 100 shown in FIG. 4A, with a portion of the base portion 110B of the housing 110 shown in dotted lines. FIG. 4D is a rear perspective view of the example HMD 100 shown in FIG. 4A, with a portion of the base portion 110B of the housing 110 shown in dotted lines, and the optical component assembly 150 removed, to further illustrate the positioning of the first air channel(s) 450A and the second air channel(s) 450B. FIG. 4E is a front perspective view of the example HMD 100 shown in FIG. 4A, with a portion of the front portion 110A of the housing 110 shown in dotted lines, to further illustrate the positioning of the first air channel(s) 450A and the second air channel(s) 450B leading into the electronics compartment 440. In some implementations, two fans 410 may be installed in the electronics compartment 440, as illustrated in the example shown in FIG. 4E. In some implementations, more, or fewer, fans (such as, for example, the fan 410), may be included in the HMD 100 to generate a desired amount of suction force and corresponding volume of air flow through the HMD 100 as described herein.

In some implementations, the terminal ends of the air channels 450 may be positioned to guide air in a desired direction in the electronics compartment 440 in response to the suction force generated by the fan(s) 410 and the resulting air flow through the HMD 100. A gap may be formed between the terminal end of each of the air channels 450 and a front surface 115 of the front portion 110A of the housing 110. This gap may allow the air to flow across the electronic components, such as, for example, the controller and/or processor, housed in the electronics compartment, and to be drawn through the fan(s) 410, for discharge from the HMD 100.

Figure 5A:
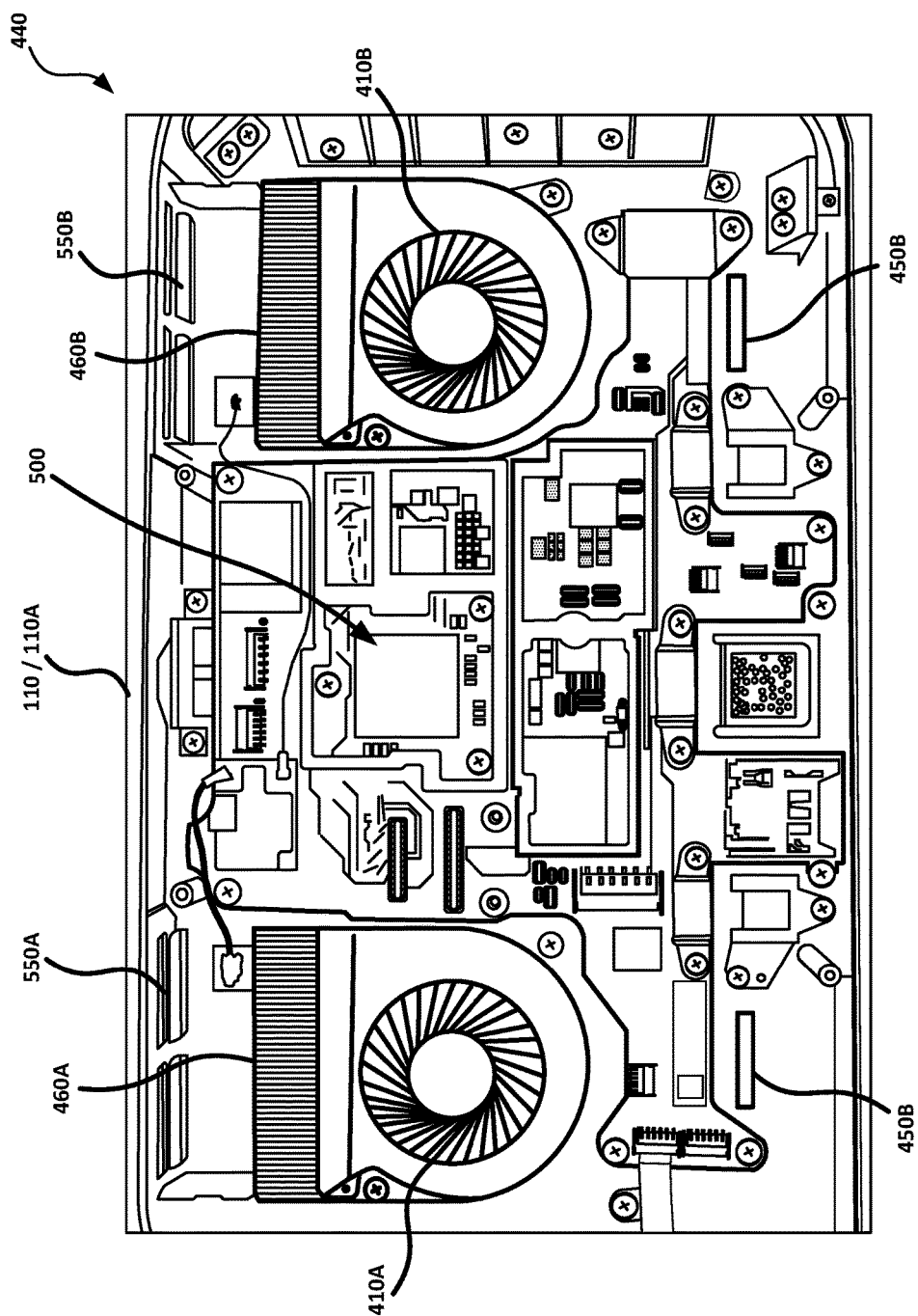
FIGS. 5A-5B illustrate an electronics compartment of an example HMD, in accordance with implementations described herein.
Figure 5B:
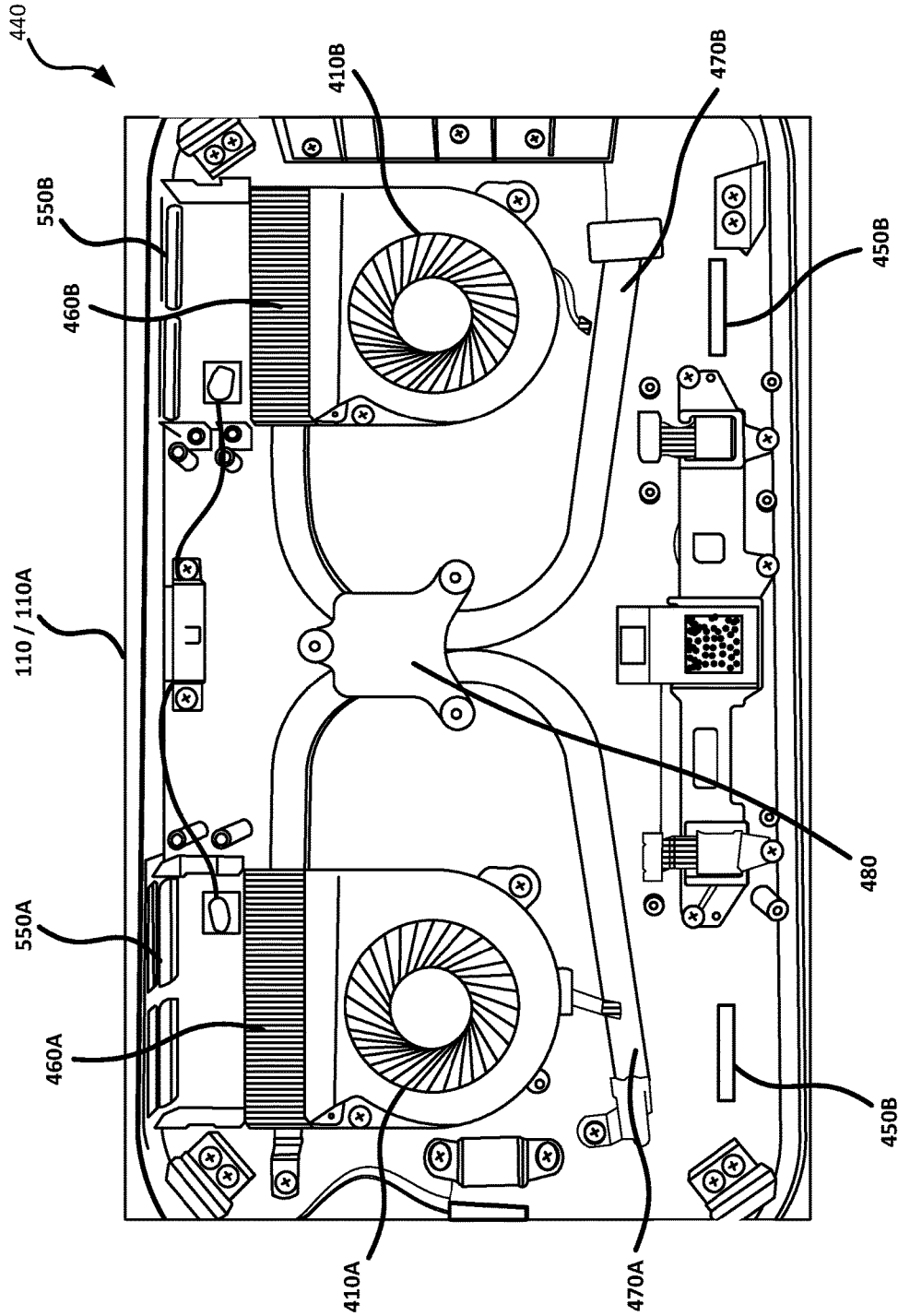

FIG. 5A is a front view of the electronics compartment 440 of the HMD 100, with the front surface 115 of the front portion 110A of the housing 110 removed, so that the cooling system and various exemplary electronic components received within the electronic compartment are visible. FIG. 5B is a front view of the electronics compartment 440 of the HMD 100, with the front surface 115 of the front portion 110A of the housing 110 removed, and with no electronic components installed, so that the various elements of the cooling system are visible. The example cooling system shown in FIGS. 5A and 5B includes two fans 410, simply for ease of discussion and illustration. However, as noted above, the cooling system may include more, or fewer fans, and/or fans having different sizes and/or air flow capacities, based on an amount of air to be moved through the HMD 100 and/or a desired air flow rate.

As shown in FIG. 5A, a central processing unit (CPU) 500, or processor 500, may be installed in the electronics compartment 440. In this example, a first fan 410A and a second fan 410B are installed in the electronics compartment 440, with the processor 500 arranged between the fans 410A, 410B. A first heat sink 460A is aligned with a discharge portion of the first fan 410A, which is in turn aligned with a first discharge area 550A, or first discharge port 550A, defined in the front portion 110A of the housing 110. A second heat sink 460B is aligned with a discharge portion of the second fan 410B, which is in turn aligned with a second discharge area 550B, or second discharge port 550B, defined in the front portion 110A of the housing 110.

As shown in FIG. 5B, in some implementations, the processor 500 may be positioned on a plate 480. The processor 500 may be positioned on the plate 480 so that one or more heat pipes 470, for example, a first heat pipe 470A and a second heat pipe 470B, may absorb heat from the processor 500 and draw heat away from the processor 500 to the first and second heat sinks 460A, 460B. In some implementations, the first and second heat pipes 470A, 470B may be in thermal contact with the housing 110. This may allow the heat pipes 470A, 470B to transfer thermal energy, or heat, from components such as the processor 500 to an outside of the HMD 100 via the housing 110. This may spread heat out, across a relatively large area of this portion of the HMD 100, allowing natural convection and radiation to assist in heat dissipation. This may allow the system to make use of natural convection and radiation through the exterior surface of the housing 110 for heat dissipation, as well as the forced convection cooling provided by the fan(s) 410.

Accordingly, in an HMD including a cooling system, in accordance with implementations described herein, operation of one or more fans as described above may provide cooling in the user-facing cavity to inhibit and/or reduce fogging of the optical components and improve user comfort. In some implementations, operation of one or more fans as described above may also facilitate the cooling of electronic components in the electronics compartment through movement of air through the electronics compartment and cooling of one or more heat sinks as air is discharged from the one or more fans.

In some implementations, the one or more fans may operate substantially continuously. In some implementations, the one or more fans may operate intermittently, for example, based on a schedule that is set by the manufacturer and/or on a schedule that is set by the user. In some implementations, the one or more fans may operate based on temperature and/or humidity levels in the user-facing cavity sensed by temperature and/or humidity sensors in the HMD, and/or based on temperature levels associated with electronic components of the HMD sensed by temperature sensors associated with the components. For example, operation of the one or more fans may be triggered in response to a sensed temperature and/or humidity level that is greater than or equal to a threshold temperature and/or humidity level. In some implementations, operation of the one or more fans may be synchronized with audio content associated with the immersive virtual experience. For example, in some implementations, operation of the one or more fans may be triggered when acoustic levels associated with the content (audio and visual) presented to the user by the HMD are greater than or equal to a threshold acoustic level. In this manner, noise associated with the operation of the one or more fans may be less perceptible to the user.

Numerous factors such as, for example, noise and vibration generated by operation of the fan(s) 410, weight, power consumption, space occupied by the fan(s) 410, and other such factors and/or combinations of factors may be taken into consideration in determining a number of fan(s) 410 and/or a size and/or a type of fan(s) 410 to be installed in a particular HMD. Similarly, numerous factors may be taken into consideration when determining a number and/or a size and/or a placement of the plurality of air intake areas 430, or air intake ports 430, and a number and/or a size and/or a placement of the plurality of air channels 450. Numerous different combinations of numbers and/or sizing and/or placement of the air channels 450, numbers and/or sizing and/or placement of the fan(s) 410, and the like may be varied in different combinations to achieve a desired level of air flow performance through the HMD 100.

For example, in some implementations, the HMD 100 may include four air channels 450 providing for air flow from the user-facing cavity 420 to the electronics compartment 440 as described above. For a fan having a given airflow capacity, this arrangement may include, for example, two first air channels 450A arranged along a top portion of the HMD 100, and two second air channels 450 arranged along a bottom portion of the HMD 100. In some implementations including four air channels 450, each of the air channels 450 may have a width of approximately 20.0 mm, and a height of approximately 3.0 mm. In some implementations including four air channels 450, these dimensions may be varied to provide a similar flow of air from the user-facing cavity 420 to the electronics compartment 440.

In some implementations, the HMD 100 may include two air channels 450 providing for air flow from the user-facing cavity 420 to the electronics compartment 440. For a fan having a given airflow capacity, this arrangement may include, for example, two second air channels 450B arranged along a bottom portion of the HMD 100. In some implementations including two air channels 450, each of the air channels 450 may have a width of approximately 35.0 mm, and a height of approximately 5.0 mm. In some implementations including two air channels 450, these dimensions may be varied to provide a similar flow of air from the user-facing cavity 420 to the electronics compartment 440.

Figure 6:
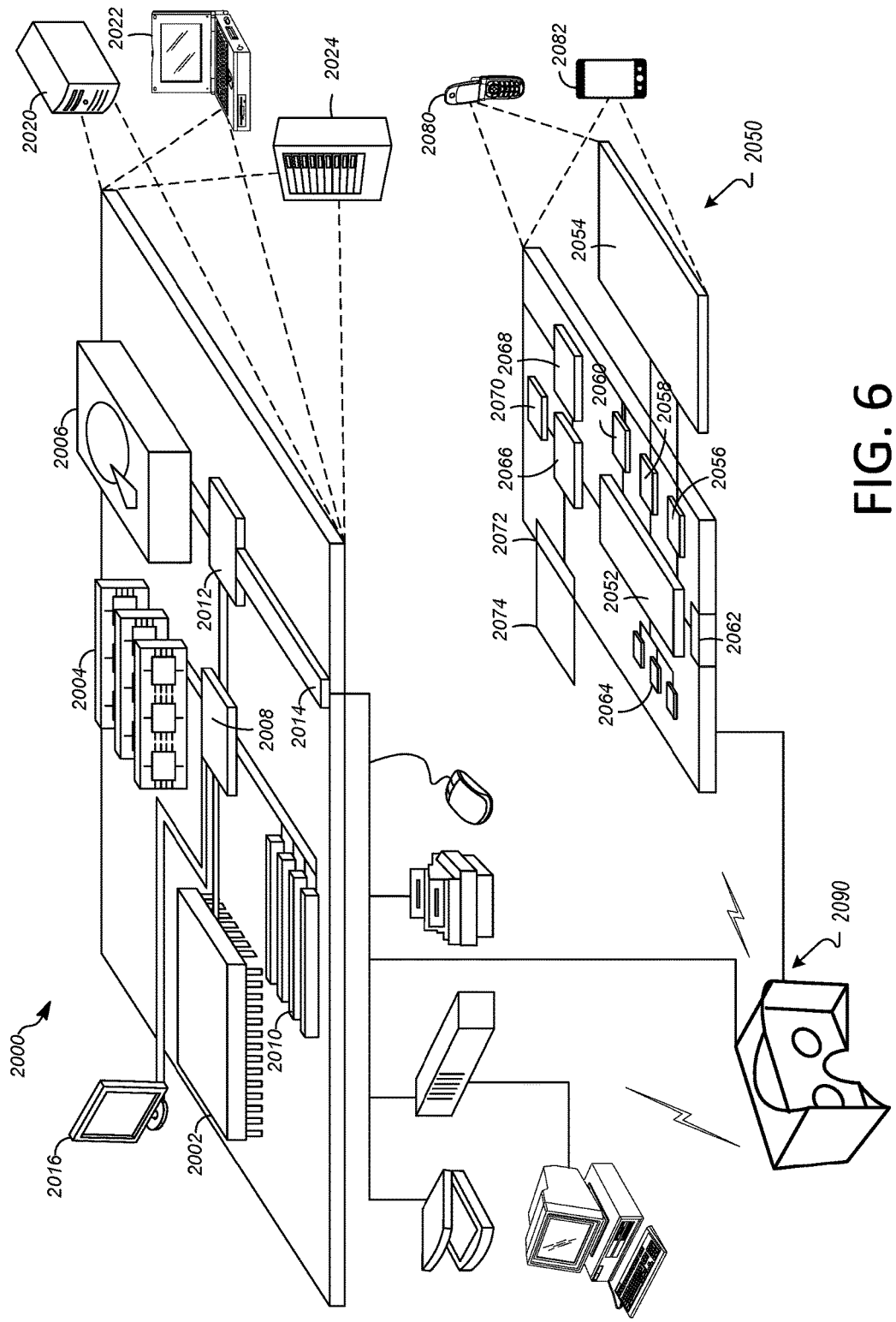
FIG. 6 shows an example of a computer device and a mobile computer device that can be used to implement the techniques described here.

FIG. 6 shows an example of a computer device 2000 and a mobile computer device 2050, which may be used with the techniques described here. Computing device 2000 includes a processor 2002, memory 2004, a storage device 2006, a high-speed interface 2008 connecting to memory 2004 and high-speed expansion ports 2010, and a low speed interface 2012 connecting to low speed bus 2014 and storage device 2006. Each of the components 2002, 2004, 2006, 2008, 2010, and 2012, are interconnected using various busses, and may be mounted on a common motherboard or in other manners as appropriate. The processor 2002 can process instructions for execution within the computing device 2000, including instructions stored in the memory 2004 or on the storage device 2006 to display graphical information for a GUI on an external input/output device, such as display 2016 coupled to high speed interface 2008. In other implementations, multiple processors and/or multiple buses may be used, as appropriate, along with multiple memories and types of memory. Also, multiple computing devices 2000 may be connected, with each device providing portions of the necessary operations (e.g., as a server bank, a group of blade servers, or a multi-processor system).

The memory 2004 stores information within the computing device 2000. In one implementation, the memory 2004 is a volatile memory unit or units. In another implementation, the memory 2004 is a non-volatile memory unit or units. The memory 2004 may also be another form of computer-readable medium, such as a magnetic or optical disk.

The storage device 2006 is capable of providing mass storage for the computing device 2000. In one implementation, the storage device 2006 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 2004, the storage device 2006, or memory on processor 2002.

The high speed controller 2008 manages bandwidth-intensive operations for the computing device 2000, while the low speed controller 2012 manages lower bandwidth-intensive operations. Such allocation of functions is exemplary only. In one implementation, the high-speed controller 2008 is coupled to memory 2004, display 2016 (e.g., through a graphics processor or accelerator), and to high-speed expansion ports 2010, which may accept various expansion cards (not shown). In the implementation, low-speed controller 2012 is coupled to storage device 2006 and low-speed expansion port 2014. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 2000 may be implemented in a number of different forms, as shown in the figure. For example, it may be implemented as a standard server 2020, or multiple times in a group of such servers. It may also be implemented as part of a rack server system 2024. In addition, it may be implemented in a personal computer such as a laptop computer 2022. Alternatively, components from computing device 2000 may be combined with other components in a mobile device (not shown), such as device 2050. Each of such devices may contain one or more of computing device 2000, 2050, and an entire system may be made up of multiple computing devices 2000, 2050 communicating with each other.

Computing device 2050 includes a processor 2052, memory 2064, an input/output device such as a display 2054, a communication interface 2066, and a transceiver 2068, among other components. The device 2050 may also be provided with a storage device, such as a microdrive or other device, to provide additional storage. Each of the components 2050, 2052, 2064, 2054, 2066, and 2068, are interconnected using various buses, and several of the components may be mounted on a common motherboard or in other manners as appropriate.

The processor 2052 can execute instructions within the computing device 2050, including instructions stored in the memory 2064. The processor may be implemented as a chipset of chips that include separate and multiple analog and digital processors. The processor may provide, for example, for coordination of the other components of the device 2050, such as control of user interfaces, applications run by device 2050, and wireless communication by device 2050.

Processor 2052 may communicate with a user through control interface 2058 and display interface 2056 coupled to a display 2054. The display 2054 may be, for example, a TFT LCD (Thin-Film-Transistor Liquid Crystal Display) or an OLED (Organic Light Emitting Diode) display, or other appropriate display technology. The display interface 2056 may comprise appropriate circuitry for driving the display 2054 to present graphical and other information to a user. The control interface 2058 may receive commands from a user and convert them for submission to the processor 2052. In addition, an external interface 2062 may be provided in communication with processor 2052, so as to enable near area communication of device 2050 with other devices. External interface 2062 may provide, for example, for wired communication in some implementations, or for wireless communication in other implementations, and multiple interfaces may also be used.

The memory 2064 stores information within the computing device 2050. The memory 2064 can be implemented as one or more of a computer-readable medium or media, a volatile memory unit or units, or a non-volatile memory unit or units. Expansion memory 2074 may also be provided and connected to device 2050 through expansion interface 2072, which may include, for example, a SIMM (Single In Line Memory Module) card interface. Such expansion memory 2074 may provide extra storage space for device 2050, or may also store applications or other information for device 2050. Specifically, expansion memory 2074 may include instructions to carry out or supplement the processes described above, and may include secure information also. Thus, for example, expansion memory 2074 may be provided as a security module for device 2050, and may be programmed with instructions that permit secure use of device 2050. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 2064, expansion memory 2074, or memory on processor 2052, that may be received, for example, over transceiver 2068 or external interface 2062.

Device 2050 may communicate wirelessly through communication interface 2066, which may include digital signal processing circuitry where necessary. Communication interface 2066 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 2068. In addition, short-range communication may occur, such as using a Bluetooth, Wi-Fi, or other such transceiver (not shown). In addition, GPS (Global Positioning System) receiver module 2070 may provide additional navigation- and location-related wireless data to device 2050, which may be used as appropriate by applications running on device 2050.

Device 2050 may also communicate audibly using audio codec 2060, which may receive spoken information from a user and convert it to usable digital information. Audio codec 2060 may likewise generate audible sound for a user, such as through a speaker, e.g., in a handset of device 2050. Such sound may include sound from voice telephone calls, may include recorded sound (e.g., voice messages, music files, etc.) and may also include sound generated by applications operating on device 2050.

The computing device 2050 may be implemented in a number of different forms, as shown in the figure. For example, it may be implemented as a cellular telephone 2080. It may also be implemented as part of a smart phone 2082, personal digital assistant, or other similar mobile device.

Various implementations of the systems and techniques described here can be reali20ed in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

In some implementations, the computing devices depicted in FIG. 6 can include sensors that interface with a virtual reality (VR headset/HMD device 2090). For example, one or more sensors included on a computing device 2050 or other computing device depicted in FIG. 6, can provide input to VR headset 2090 or in general, provide input to a VR space. The sensors can include, but are not limited to, a touchscreen, accelerometers, gyroscopes, pressure sensors, biometric sensors, temperature sensors, humidity sensors, and ambient light sensors. The computing device 2050 can use the sensors to determine an absolute position and/or a detected rotation of the computing device in the VR space that can then be used as input to the VR space. For example, the computing device 2050 may be incorporated into the VR space as a virtual object, such as a controller, a laser pointer, a keyboard, a weapon, etc. Positioning of the computing device/virtual object by the user when incorporated into the VR space can allow the user to position the computing device so as to view the virtual object in certain manners in the VR space. For example, if the virtual object represents a laser pointer, the user can manipulate the computing device as if it were an actual laser pointer. The user can move the computing device left and right, up and down, in a circle, etc., and use the device in a similar fashion to using a laser pointer.

In some implementations, one or more input devices included on, or connect to, the computing device 2050 can be used as input to the VR space. The input devices can include, but are not limited to, a touchscreen, a keyboard, one or more buttons, a trackpad, a touchpad, a pointing device, a mouse, a trackball, a joystick, a camera, a microphone, earphones or buds with input functionality, a gaming controller, or other connectable input device. A user interacting with an input device included on the computing device 2050 when the computing device is incorporated into the VR space can cause a particular action to occur in the VR space.

In some implementations, a touchscreen of the computing device 2050 can be rendered as a touchpad in VR space. A user can interact with the touchscreen of the computing device 2050. The interactions are rendered, in VR headset 2090 for example, as movements on the rendered touchpad in the VR space. The rendered movements can control virtual objects in the VR space.

In some implementations, one or more output devices included on the computing device 2050 can provide output and/or feedback to a user of the VR headset 2090 in the VR space. The output and feedback can be visual, tactical, or audio. The output and/or feedback can include, but is not limited to, vibrations, turning on and off or blinking and/or flashing of one or more lights or strobes, sounding an alarm, playing a chime, playing a song, and playing of an audio file. The output devices can include, but are not limited to, vibration motors, vibration coils, piezoelectric devices, electrostatic devices, light emitting diodes (LEDs), strobes, and speakers.

In some implementations, the computing device 2050 may appear as another object in a computer-generated, 3D environment. Interactions by the user with the computing device 2050 (e.g., rotating, shaking, touching a touchscreen, swiping a finger across a touch screen) can be interpreted as interactions with the object in the VR space. In the example of the laser pointer in a VR space, the computing device 2050 appears as a virtual laser pointer in the computer-generated, 3D environment. As the user manipulates the computing device 2050, the user in the VR space sees movement of the laser pointer. The user receives feedback from interactions with the computing device 2050 in the VR environment on the computing device 2050 or on the VR headset 2090.

In some implementations, a computing device 2050 may include a touchscreen. For example, a user can interact with the touchscreen in a particular manner that can mimic what happens on the touchscreen with what happens in the VR space. For example, a user may use a pinching-type motion to zoom content displayed on the touchscreen. This pinching-type motion on the touchscreen can cause information provided in the VR space to be zoomed. In another example, the computing device may be rendered as a virtual book in a computer-generated, 3D environment. In the VR space, the pages of the book can be displayed in the VR space and the swiping of a finger of the user across the touchscreen can be interpreted as turning/flipping a page of the virtual book. As each page is turned/flipped, in addition to seeing the page contents change, the user may be provided with audio feedback, such as the sound of the turning of a page in a book.

In some implementations, one or more input devices in addition to the computing device (e.g., a mouse, a keyboard) can be rendered in a computer-generated, 3D environment. The rendered input devices (e.g., the rendered mouse, the rendered keyboard) can be used as rendered in the VR space to control objects in the VR space.

Computing device 2000 is intended to represent various forms of digital computers and devices, including, but not limited to laptops, desktops, workstations, personal digital assistants, servers, blade servers, mainframes, and other appropriate computers. Computing device 2050 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

A number of embodiments have been described. Nevertheless, it will be understood that various modifications may be made without departing from the spirit and scope of the specification.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A head mounted display device, comprising:
   a housing;
   an optical component assembly installed at an intermediate portion of the housing;
   a first cavity defined by a first peripheral portion of the housing and a first side portion of the optical component assembly installed in the housing, wherein the first cavity is a user facing cavity configured to interface with a head of a user;
   a second cavity defined by a second peripheral portion of the housing and a second side portion of the optical component assembly opposite the second side portion thereof, wherein the second cavity is configured to receive at least one electronic component therein;
   at least one fan installed in the second cavity;
   a plurality of air intake ports defined in a peripheral wall portion of the first cavity;
   a plurality of air channels connecting the first cavity and the second cavity; and
   at least one air discharge port defined in a peripheral wall portion of the second cavity, at a position corresponding to the at least one fan.

2. The device of claim 1, wherein a suction force generated by the at least one fan draws air into the first cavity through the plurality of air intake ports, and draws air from the first cavity into the second cavity through the plurality of air channels.

3. The device of claim 2, wherein the at least one fan is configured to discharge air from the second cavity out of the housing through the at least one discharge port.

4. The device of claim 3, further comprising:
   at least one heat pipe in thermal communication with at least one electronic component in the second cavity; and
   at least one heat sink in thermal communication with the at least one heat pipe.

5. The device of claim 4, wherein the at least one heat sink is positioned between an exhaust portion of the at least one fan and the at least one discharge port, such that air discharged by the at least one fan is directed across the at least one heat sink prior to discharge from the housing through the at least one discharge port.

6. The device of claim 4, wherein the at least one heat pipe is in thermal contact with a portion of the housing so as to transfer thermal energy, absorbed by the at least one heat pipe from the at least one electronic component, to an outside of the housing.

7. The device of claim 1, wherein the plurality of air channels includes:
   at least one first air channel extending through an upper portion of the optical component assembly to provide for air flow communication between an upper portion of the first cavity and an upper portion of the second cavity; and
   at least one second air channel extending through a lower portion of the optical component assembly to provide for air flow communication between a lower portion of the first cavity and a lower portion of the second cavity.

8. The device of claim 7, wherein
   a terminal end of the at least one first air channel is positioned above the at least one fan in the second cavity, and
   a terminal end of the at least one second air channel is positioned below the at least one fan in the second cavity.

9. The device of claim 1, wherein,
   in a first mode, the at least one fan is configured to operate continuously when the head mounted display device is in an on-state, and
   in a second mode, the at least one fan is configured to operate in response to a detected temperature in the head mounted display device that is greater than a threshold temperature, and to suspend operation the detected temperature is less than or equal to the threshold temperature.

10. The device of claim 9, wherein the first cavity is a user-facing cavity, and the detected temperature is a temperature in the user-facing cavity.

11. The device of claim 9, wherein the second cavity is an electronics compartment, and the detected temperature is a temperature in the electronics compartment, or a temperature of one or more electronic components installed in the electronics compartment.

12. The device of claim 9, wherein, in a third mode, the at least one fan is configured to operate when an audio output level associated with content output by the head mounted display device is greater than or equal to a threshold audio output level.

13. A head mounted display device, comprising:
    a housing;
    an optical component assembly installed in the housing;
    a first cavity mounted on a user's head and defined in the housing, at a first side of the optical component assembly, wherein the first cavity is a user facing cavity configured to interface with a head of a user;
    a second cavity defined in the housing, at a second side of the optical component assembly opposite the first side thereof, wherein the second cavity is configured to receive at least one electronic component therein;
    at least one air channel connecting the first cavity and the second cavity;
    at least one electronic component installed in the second cavity; and a cooling system, including:
- at least one fan installed in the second cavity;
- at least one heat sink installed in the second cavity, at a position corresponding to an exhaust side of the at least one fan; and
- at least one heat pipe in thermal contact with the at least one electronic component installed in the second cavity, and in thermal contact with the at least one heat sink, so as to transfer heat absorbed from the at least one electronic component to the at least one heat sink.

14. The device of claim 13, further comprising:
at least one air intake port defined in a peripheral wall portion of the first cavity, wherein the at least one fan is configured to generate a suction force that draws air from the first cavity into the second cavity through the at least one air channel.

15. The device of claim 14, further comprising:
at least one air discharge port defined in a peripheral wall portion of the second cavity, at a position corresponding to the exhaust side of the at least one fan, wherein the fan is configured to draw air from the second cavity into a suction side of the fan, and to discharge air from the fan through a discharge side of the fan and across the at least one heat sink, so as to discharge the air through the at least one air discharge port.

16. The device of claim 13, wherein,
- in a first mode, the at least one fan is configured to operate continuously when the head mounted display device is in an on-state, and
- in a second mode, the at least one fan is configured to operate in response to a detected temperature in the head mounted display device that is greater than a threshold temperature, and to suspend operation the detected temperature is less than or equal to the threshold temperature.

17. The device of claim 16, wherein the first cavity is a user facing cavity, and the detected temperature is a temperature in the first cavity of the housing.

18. The device of claim 16, wherein the second cavity is an electronics compartment, and the detected temperature is a temperature in the second cavity of the housing, or a temperature of one or more electronic components installed in the second cavity of the housing.

19. The device of claim 13, wherein, in a third mode, the at least one fan is configured to operate when an audio output level associated with content output by the head mounted display device is greater than or equal to a threshold audio output level.

20. The device of claim 1, wherein the first cavity is a user-facing cavity, and the second cavity is an electronics compartment.

* * * * *